(12) United States Patent
Papadas et al.

(10) Patent No.: US 6,465,332 B1
(45) Date of Patent: Oct. 15, 2002

(54) METHOD OF MAKING MOS TRANSISTOR WITH HIGH DOPING GRADIENT UNDER THE GATE

(75) Inventors: Constantin Papadas, Gieres; Jorge L. Regolini, Bernin; Thomas Skotnicki, Crolles; André Grouillet, Grenoble; Christine Morin, Seyssins, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/402,853

(22) PCT Filed: Apr. 14, 1998

(86) PCT No.: PCT/JP98/00751
§ 371 (c)(1),
(2), (4) Date: Jan. 10, 2000

(87) PCT Pub. No.: WO98/47173
PCT Pub. Date: Oct. 22, 1998

(30) Foreign Application Priority Data

Apr. 11, 1997 (FR) .............................. 97 04710

(51) Int. Cl.⁷ .............................................. H01L 21/36
(52) U.S. Cl. .................. 438/480; 438/305; 438/528
(58) Field of Search ........................... 438/305, 506, 438/528, FOR 188, FOR 158, 480, 916, FOR 255; 257/402, 408

(56) References Cited

U.S. PATENT DOCUMENTS 4,082,571 A    4/1978   Graul et al.
4,885,257 A  * 12/1989  Matsushita
4,956,693 A    9/1990   Sawahata et al.
5,557,129 A    9/1996   Oda et al.

FOREIGN PATENT DOCUMENTS

EP    0 253 059 A2   1/1988
EP    0 530 046 A    3/1993   ........... H01L/29/10
FR    2 301 923 A    9/1976

OTHER PUBLICATIONS

International Preliminary Examination Report from International Patent Application No. PCT/FR98/00751.
High performance FET Structure Made Using Medium to Low Temperature Epitaxy, IBM Technical Disclosure Bulletin, vol. 33, No. 11, Apr. 1, 1991, pp. 53–55, XP000110307.

* cited by examiner

Primary Examiner—George Fourson
Assistant Examiner—Thanh V Pham
(74) Attorney, Agent, or Firm—Wolf, Greenfield & Sacks, P.C.; James H. Morris

(57) ABSTRACT

The invention is directed to a method of manufacturing an area of a first type of conductivity extending a depth into a semiconductor substrate and having a doping gradient as a function of the depth into the semiconductor substrate. The method comprises acts of providing a semiconductor substrate of the first type of conductivity; implanting nitrogen in an upper surface of the semiconductor substrate, with a dose in a range of between approximately $5.10^{13}$ and $5.10^{15}$ at./cm², annealing the semiconductor substrate; and growing an epitaxial layer on the substrate of the first type of conductivity having a doping level lower than the semiconductor substrate.

12 Claims, 2 Drawing Sheets

METHOD OF MAKING MOS TRANSISTOR WITH HIGH DOPING GRADIENT UNDER THE GATE

The present invention generally relates to the field of semiconductors. More particularly, the present invention relates to the formation of a very thin epitaxial layer on a more heavily-doped substrate. The present invention especially applies to the manufacturing of MOS transistors. It more specifically aims at MOS transistors having very small dimensions in which the gate length is significantly lower than one micrometer, for example, from less than 0.1 μm to approximately 0.5 μm.

FIG. 1 very schematically shows a cross-sectional view of a conventional MOS transistor. This MOS transistor is formed in an active area of a single-crystal silicon substrate 1 delimited by a thick oxide region 2. This thick oxide region has been shown as corresponding to a region obtained by oxide growth according to a so-called LOCOS technique. It could correspond to any known type of active area definition, for example hollowing of the silicon surface and oxide filling. The MOS transistor includes a gate 4 provided with lateral spacers 5, currently made of silicon oxide or nitride. Gate 4 is separated from the silicon surface by a gate oxide layer 6. The drain and the source are shown as being LDD-type, that is, including more lightly-doped regions 10 and 11 extending to the gate limits and more heavily-doped regions 12 and 13 substantially extending to the spacer limits. Conventionally, regions 10 and 11 are formed by implantation, using gate 4 as a mask, and regions 12 and 13 are formed by implantation, using gate 4 widened by spacers 5 as a mask.

In the shown case of an N-channel MOS transistor, the substrate is of type P and regions 10 to 13 are of type N. The operating mode of such MOS transistors is well known. When a voltage is applied to gate 4, the apparent type of conductivity of the surface substrate is inverted under the gate region and an inversion or depletion layer forms, which constitutes a channel region between regions 10 and 11. This channel ensures a conduction between the source and the drain if a proper voltage is applied between source and drain.

As is known, this MOS transistor is subject to various parasitic effects and especially to the "punch-through" phenomenon. Punch-through especially occurs when the doping under the gate is such that, for a certain gate voltage, the inverted area under the gate extends deeply between heavily-doped source and drain regions 12 and 13. As a result of the punch-through effect, the MOS transistor does not turn back off. if the voltage remains applied between source and drain while the gate voltage is interrupted.

When the MOS transistor has minimum dimensions higher than one micrometer, the drain-substrate and source-substrate junctions are relatively deep and this punch-through phenomenon can be avoided by known means. Conversely, when the dimensions of the MOS transistor become significantly submicronic (that is, when the gate length becomes lower than one micrometer, for example, from on the order of less than 0.1 μm to approximately 0.5 μm), all the transistor dimensions are reduced accordingly and, especially, the junctions become very shallow. For example, junction depth x1 of regions 10 and 11 can be on the order of 50 nm (500 angstroms) and junction depth x2 of regions 12 and 13 can be on the order of 200 nm. In such conditions, the punch-through phenomenon is particularly acute.

One of the known means to avoid punch-through consists of making, in the channel area, a more lightly-doped upper area followed by a more heavily-doped region (refer to European patent application 0 530 046 of SGS-Thomson Microelectronics INC.). Then, when the gate is excited, the depletion area is limited to the thickness of the less doped region and there is no inversion of the more doped region.

This means that it is desired to obtain a vertical doping profile under the gate such as that represented by curve 20 of FIG. 2 with a first doping level c1 when the depth is lower than x0, depth x0 being lower than junction depth x1, and a second clearly higher level of doping c2 at least in a region determined beyond depth x0.

Further, obtaining of such a profile enables proper control of the threshold voltage and, if the lowest doping level is sufficiently low, to have high mobility in the channel.

However, if it is possible to obtain such a profile for devices of minimum dimensions on the order of one micrometer or even 0.5 μm, this becomes impossible in practice with current techniques when the dimensions decrease. Indeed, to make a profile such as that illustrated in FIG. 2, a first more heavily-doped layer followed by a more lightly-doped layer, for example formed by epitaxy, have to be formed in the P substrate. However, during the subsequent anneals and especially during the drive-in anneals of the source and drain regions, there will be a drive-in of the P-type dopants under the gate and, instead of obtaining a very clear doping gradient such as that illustrated by curve 20, an attenuated gradient such as that designated by curve 21 is finally obtained.

Conventional means do not solve this problem when the desired value of x0 is, for example, on the order of 20 to 50 nm. Indeed, it is known to limit the outdiffusion of a buried layer under a relatively thick epitaxial layer by providing a large implantation of atoms such as nitrogen at a concentration of about $10^{18}$ at./cm$^3$ (U.S. Pat. No. 4,082,571) or in the range of $10^{18}$ to $10^{22}$ at./cm$^3$ (U.S. Pat. No. 4 956 693). For such nitrogen concentrations, a portion of the epitaxial layer is unavoidably impaired close to the interface with the underlying layer. Such methods have accordingly not been considered in case the thickness of the desired epitaxial layer is in the range of 20 to 50 nm.

Thus, an object of the present invention is to provide a method of obtaining of a doping profile with a very steep gradient, this doping profile remaining steep after thermal anneal operations.

Another object of the present invention is to apply this method to the manufacturing of a MOS transistor of very small dimension (less than 0.1 to 0.5 micrometer of gate length).

The present invention also aims at a MOS transistor obtained by the method of the present invention.

To achieve these and other objects, the present invention provides a method of manufacturing an area of the first type of conductivity with a steep doping gradient across the thickness, including the steps of providing a single-crystal semiconductor substrate, coating the substrate with a thin oxide layer implanting nitrogen in the upper surface of the substrate the nitrogen dose is approximately between $5.10^{13}$ and $5.10^{15}$ at./cm$^2$, annealing, and growing an epitaxial layer of lower doping level than the substrate, or an intrinsic layer.

According to an embodiment of the present invention, the method includes using a substrate of any type of conductivity and performing a nitrogen implantation and an implantation of atoms of the dopant of a first type of conductivity, before making an epitaxial layer of the first type of conductivity of low doping level, or an intrinsic layer.

According to an embodiment of the present invention, the nitrogen dose is comprised between 1 and $10.10^{14}$ at./cm$^2$, and preferably between 3 and $7.10^{14}$ at./cm$^2$.

According to an embodiment of the present invention, the nitrogen is implanted at an energy on the order of 10 keV.

According to an embodiment of the present invention, the epitaxial layer has a thickness on the order of 30 to 60 nm.

This method applies to the manufacturing of the area located under the gate of a MOS transistor from a substrate of the first type of conductivity.

Thus, the present invention also aims at an LDD-type MOS transistor including, under its gate area, a first lightly-doped region followed by a second region of the same type of conductivity of higher doping level with a significant doping gradient between the two regions, in which the interface area between the two regions contains nitrogen atoms.

According to an embodiment of the present invention, the first region extends down to a depth substantially equal to or lower than the depth of the LDD-type lightly-doped drain and source regions.

BRIEF DESCRIPTION OF THE DRAWINGS

The foregoing objects, features and advantages of the present invention will be discussed in detail in the following non-limiting description of specific embodiments in connection with the accompanying drawings, wherein.

Generally, the method according to the present invention provides forming, at the surface of a silicon layer doped according to a first type of conductivity, for example, type P, a nitrogen implantation, then performing an anneal and after that, growing an epitaxial layer of the same type of conductivity as the substrate but very lightly doped or even intrinsic.

Experience teaches that, as a result of usual anneals in the field of semiconductor manufacturing, for example, drain and source drive-in anneals, the presence of the nitrogen implantation blocks any exodiffusion of the doping atoms of the initial substrate to the upper epitaxial layer. An extremely steep doping profile is thus obtained.

According to another aspect of the present invention, the method includes, after the nitrogen implantation, the implantation of a dopant, for example, boron, to obtain conductivity type P, then an anneal, and only after this, the deposition of an epitaxial layer of lower level of doping (quasi intrinsic) than that resulting from the boron implantation, the epitaxial layer being also boron-doped, preferably in-situ.

Of course, the nitrogen implantation dose will be chosen to obtain the desired result. It will have to be sufficient to ensure the blocking of an upward exodiffusion of the doping atoms contained in the substrate but will have to be low enough to avoid creating in the substrate dislocations which would prevent obtaining a single-crystal epitaxial layer of good quality. As an example, the nitrogen will be implanted under low energy, for example, 10 keV, with a dose in the range of approximately $5.10^{13}$ to $5.10^{15}$at./cm$^2$, and preferably in the range from 1 to $10.10^{14}$at./cm$^2$, and still preferably in a range from 3 to $7.10^{14}$at./cm$^2$. Thus, one obtains a maximum nitrogen surface concentration of about $10^{16}$at./cm$^3$. Owing to the thin oxide layer, the maximum nitrogen concentration is very close to the surface and the nitrogen is mainly concentrated on a depth of about 10 nm.

Now, an application of the present invention to the manufacturing of a MOS transistor will more specifically be described.

Figure 3A:
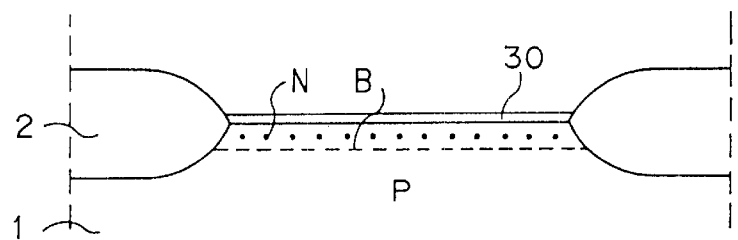
FIGS. 3A to 3C show successive steps of manufacturing of a MOS transistor according to the present invention.

As shown in FIG. 3A, the operations are performed in an active area of a substrate 1 delimited by thick oxide 2. The case where substrate 1 is initially P-type doped at a concentration on the order of approximately $10^{16}$at./cm$^3$ will be considered. Preferably, the substrate is covered with a thin oxide layer 30.

Nitrogen atoms are implanted at the surface under 10 keV at a dose about approximately 3 to $7.10^{14}$at./cm$^2$.

Then, boron is implanted at a dose adequate for providing, after anneal, a maximum doping about approximately $10^{18}$at./cm$^3$.

An anneal is then performed, for example, at 800° C. during 10 minutes.

Figure 3B:
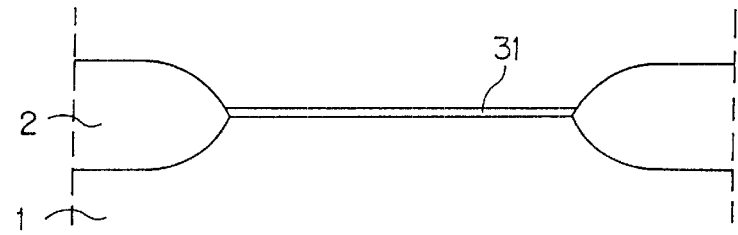

At a subsequent step, the result of which is illustrated in FIG. 3B, oxide layer 30 is removed and an intrinsic or lightly-doped, for example with boron, P-type silicon layer 31, with a doping concentration on the order of approximately $10^{15}$atoms/cm$^3$, is grown by epitaxy. This layer can have a very low thickness, for example, on the order of 20 to 60 nm.

Figure 1:
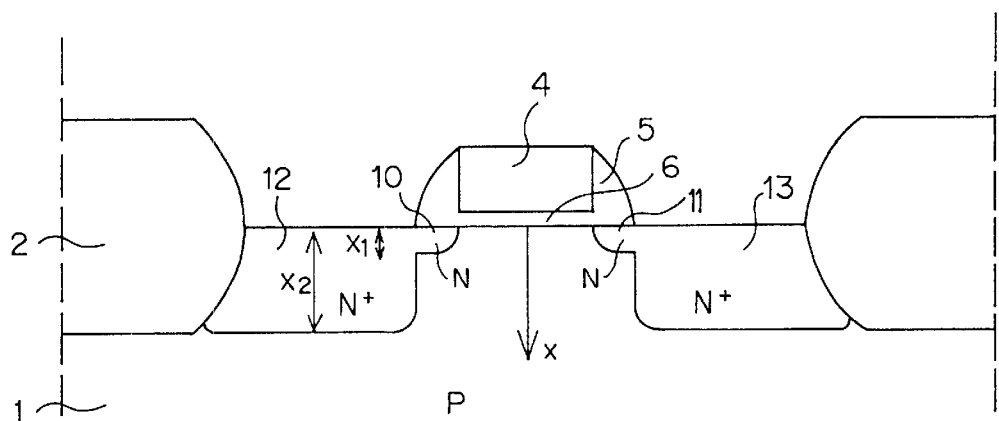
FIG. 1, previously described, schematically shows a cross-sectional view of an N-channel MOS transistor.
Figure 2:
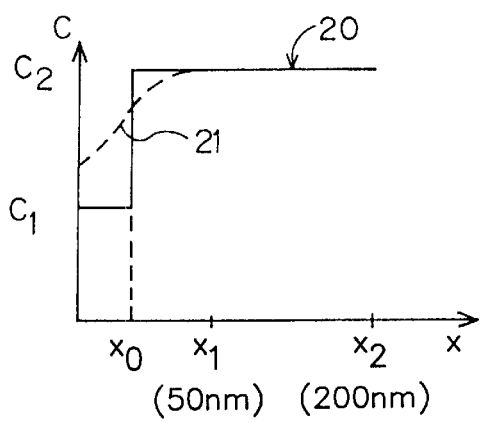
FIG. 2 shows doping profiles.
Figure 3C:
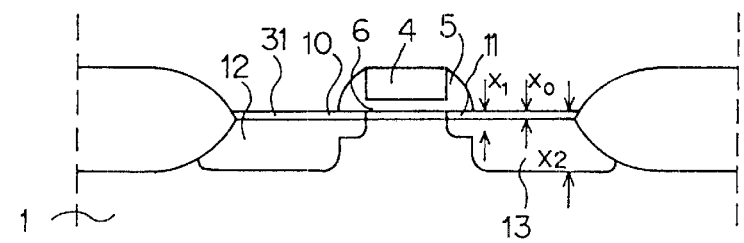

Then, a MOS transistor such as shown in FIG. 3C is conventionally created, the elements of which are designated by the same references as in FIG. 1.

Figure 4:
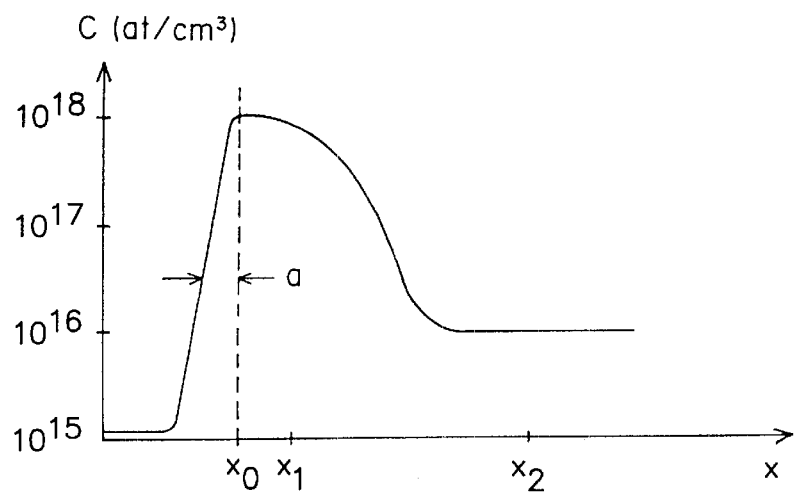
FIG. 4 shows a doping profile obtained for a MOS transistor according to the present invention.

A doping profile under the gate such as illustrated in FIG. 4, where x0 designates the thickness of epitaxial layer 31, x1 the depth of regions 10 and 11 and x2 the depth of regions 12 and 13, is then obtained after anneal. The presence of a lower region, the dopant concentration of which exhibits a high gradient with respect to that of the epitaxial layer, and extending downwards from depth x0, provides the desired result of avoiding punch-through phenomena.

In FIG. 4, the width at mid-height (logarithmic coordinates) of the curve joining the low doping level region to the high doping level region has been referred to as $a$. Clearly, the steeper the gradient exhibited by the doping profile, the lower this value $a$.

The applicant has performed tests by manufacturing an epitaxial layer 31 without the nitrogen implantation, and then an epitaxial layer 31 with the nitrogen implantation according to the present invention and has found that value a is only on the order of a score of nm in the context of the present invention but becomes substantially higher than 40 nm when an epitaxial layer 31 is made without providing any previous nitrogen implant.

As a result, a MOS transistor of extremely reduced dimensions, for example, a MOS transistor having a gate dimension of 0.12 µm, for which the values of x0, x1, and x2 would be 20, 40, and 70 nm, as indicated as an example in FIG. 4 can be manufactured.

The inventors have observed, on a completed experimental device, that the nitrogen was strongly concentrated in the interface area under the epitaxial layer.

Of course, the transistor according to the present will exhibit the desired effects of insensitivity to the punch-through phenomenon.

The present invention has been described in the context of a specific example, and more specifically in the case where the dopant is boron. One could also envision using a dopant such as, for example, indium that has a higher atomic number and diffuses more slowly to form the region of higher doping level. However, the results are not as good because indium generates dislocations which are difficult to reduce with anneals. The dopants could also be of type N.

What is claimed is:

1. A method of manufacturing an area of a first type of conductivity extending a depth into a semiconductor substrate, and having a doping gradient as a function of the depth into the semiconductor substrate, the method comprising the steps of:

providing a semiconductor substrate of the first type of conductivity;

implanting nitrogen in an upper surface of the semiconductor substrate, with a dose in a range of between approximately $5.10^{13}$ and $5.10^{15}$ at./cm$^2$, annealing the semiconductor substrate; and growing an epitaxial layer on the substrate of the first type of conductivity having a doping level lower than the semiconductor substrate.

2. The method of claim 1, further comprising a step of implanting a dopant of the first type of conductivity in the upper surface of the semiconductor substrate after the step of implanting the nitrogen and before the step of annealing the substrate.

3. The method of claim 1, wherein the step of implanting nitrogen in the upper surface of the semiconductor substrate comprises implanting the nitrogen with a dose in a range between about $1.10^{14}$ at./cm$^2$ and about $10.10^{14}$ at./cm$^2$.

4. The method of claim 1, wherein the step of implanting nitrogen in the upper surface of the semiconductor substrate comprises implanting the nitrogen with a dose in a range between about $3.10^{14}$ at./cm$^2$ and about $7.10^{14}$ at./cm$^2$.

5. The method of claim 1, wherein the step of implanting nitrogen in the upper surface of the semiconductor substrate comprises implanting the nitrogen at an energy of about 10 keV.

6. The method of claim 1, wherein the step of growing the epitaxial layer comprises growing the epitaxial layer such that it has a thickness of about 30 to 60 nm.

7. The method of claim 1, wherein the step of providing the area of the first type of conductivity further comprises providing the area under a gate of a MOS transistor.

8. The method of claim 1, further comprising a step of coating the substrate with a thin oxide layer before the step of implanting nitrogen.

9. The method of claim 8, further comprising a step of removing the thin oxide layer after the step of annealing the substrate.

10. The method of claim 7, wherein the step of providing the area of the first type of conductivity located under the gate of the MOS transistor comprises providing a first region, a second region and an interface area between the first region and the second region, wherein:

the interface area contains nitrogen atoms;

the second region is located under the first region; and the second region has a higher doping level than the first region, such that a doping gradient exists between the first region and the second region, and wherein the doping gradient comprises a difference in dopant concentration ranging from about $10^{15}$ at./cm$^3$ in the first region to about $10^{18}$ at./cm$^3$ in the second region.

11. The method of claim 10, wherein the step of providing the area of the first type of conductivity further comprises providing the first region extending a depth into the substrate of greater than or equal to 20 nm.

12. The method of claim 7, wherein the step of providing the area of the first type of conductivity under the gate of a MOS transistor further comprises providing a gate area having a width greater than or equal to 0.12 µm.

* * * * *

UNITED STATES PATENT AND TRADEMARK OFFICE
CERTIFICATE OF CORRECTION

PATENT NO. : 6,465,332 B1 Page 1 of 1
DATED : October 15, 2002
INVENTOR(S) : Constain Papadas et al.

It is certified that error appears in the above-identified patent and that said Letters Patent is hereby corrected as shown below:

<u>Title page,</u>
Item [68], should read:
-- [86] PCT No.: PCT/FR98/00751 --.

Signed and Sealed this

Twenty-ninth Day of April, 2003

JAMES E. ROGAN
*Director of the United States Patent and Trademark Office*